United States Patent
Nadeau-Dostie et al.

(10) Patent No.: US 7,424,656 B2
(45) Date of Patent: Sep. 9, 2008

(54) CLOCKING METHODOLOGY FOR AT-SPEED TESTING OF SCAN CIRCUITS WITH SYNCHRONOUS CLOCKS

(75) Inventors: Benoit Nadeau-Dostie, Gatineau (CA); Jean-François Côté, Chelsea (CA); Fadi Maamari, San Jose, CA (US)

(73) Assignee: LogicVision, Inc., San Jose, CA (US)

( * ) Notice: Subject to any disclaimer, the term of this patent is extended or adjusted under 35 U.S.C. 154(b) by 688 days.

(21) Appl. No.: 11/060,407

(22) Filed: Feb. 18, 2005

(65) Prior Publication Data

US 2005/0240790 A1    Oct. 27, 2005

Related U.S. Application Data

(60) Provisional application No. 60/579,649, filed on Jun. 16, 2004, provisional application No. 60/564,210, filed on Apr. 22, 2004.

(51) Int. Cl.
*G01R 31/28* (2006.01)

(52) U.S. Cl. ............... 714/731; 714/25; 714/709; 714/724; 714/726; 714/729; 714/744; 714/30

(58) Field of Classification Search ............ None
See application file for complete search history.

(56) References Cited

U.S. PATENT DOCUMENTS

| | | | |
|---|---|---|---|
| 5,349,587 A | | 9/1994 | Nadeau-Dostie et al. |
| 5,680,543 A * | | 10/1997 | Bhawmik ............ 714/30 |
| 6,115,827 A * | | 9/2000 | Nadeau-Dostie et al. .... 713/503 |
| 6,327,684 B1 * | | 12/2001 | Nadeau-Dostie et al. .... 714/731 |
| 6,441,666 B1 | | 8/2002 | Swanson et al. |
| 6,467,044 B1 | | 10/2002 | Lackey |
| 6,954,887 B2 * | | 10/2005 | Wang et al. ............ 714/729 |
| 7,007,213 B2 * | | 2/2006 | Wang et al. ............ 714/729 |
| 7,124,342 B2 * | | 10/2006 | Wang et al. ............ 714/741 |

(Continued)

OTHER PUBLICATIONS

Qiu et al., "K Longest Paths Per Gate (KLPG) Test Generation for Scan-Based Sequential Circuits", 2004 International Test Conference, Oct. 26-28, 2004, Charlotte, NC, Charlotte Convention Center, USA.

*Primary Examiner*—John P Trimmings
(74) *Attorney, Agent, or Firm*—Eugene E. Prouix; Dennis S.K. Leung

(57) ABSTRACT

A clocking method for at-speed scan testing for delay defects in cross-domain paths of interacting synchronous clock domains in a scan circuit, each path originating from a source memory element in one of the domains and terminating at a destination memory element in another of the domains and comprises selectively aligning either a capture edge or a launch edge of the clock of each domain with a corresponding edge of at least one other domain of the interacting synchronous clock domains to determine the cross-domain paths to be tested between a source domain and a destination domain; clocking memory elements in each domain at respective domain clock rates to launch signal transitions from source memory elements in source domains; and for each pair of interacting clock domains under test, capturing, in the destination domain, circuit responses to signal transitions launched along paths originating from the source domain and selectively disabling capturing, in the source domain, of circuit responses to signal transitions launched along paths originating from the destination domain.

21 Claims, 3 Drawing Sheets

U.S. PATENT DOCUMENTS

| | | |
|---|---|---|
| 7,210,082 B1 * | 4/2007 | Abdel-Hafez et al. ........ 714/726 |
| 2002/0147951 A1 * | 10/2002 | Nadeau-Dostie et al. .... 714/731 |
| 2003/0097614 A1 | 5/2003 | Rajski et al. |
| 2004/0268181 A1 | 12/2004 | Wang et al. |
| 2005/0235186 A1 * | 10/2005 | Wang et al. .................. 714/728 |
| 2005/0262409 A1 * | 11/2005 | Wang et al. .................. 714/738 |
| 2006/0064616 A1 * | 3/2006 | Rajski et al. ................. 714/726 |

* cited by examiner

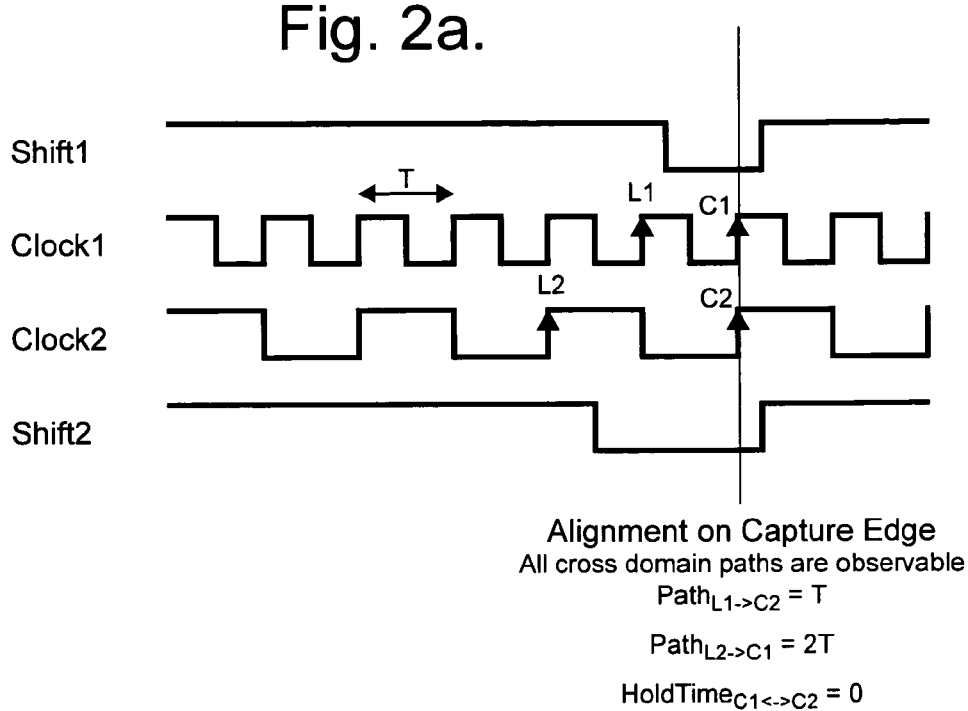
Alignment on Capture Edge
All cross domain paths are observable
$Path_{L1 \rightarrow C2} = T$
$Path_{L2 \rightarrow C1} = 2T$
$HoldTime_{C1 \leftrightarrow C2} = 0$
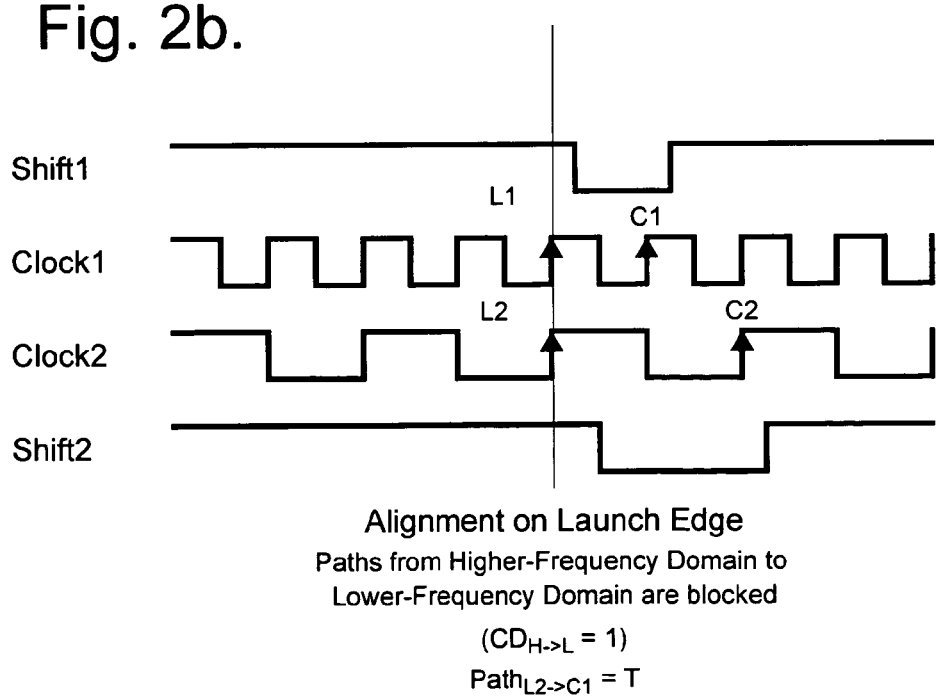
Alignment on Launch Edge
Paths from Higher-Frequency Domain to
Lower-Frequency Domain are blocked
$(CD_{H \rightarrow L} = 1)$
$Path_{L2 \rightarrow C1} = T$ Alignment on Capture Edge Paths from Lower-Frequency Domains to
Higher-Frequency Domains are blocked.

($CD_{H\to L} = 0$ and $CD_{L\to H} = 1$)

$Path_{L1\to C2} = T$ $HoldTime_{C1\to C2} = 0$

Alignment on Launch Edge

Paths from Higher-Frequency Domains to
Lower-Frequency Domains are blocked.

($CD_{H\to L} = 1$ and $CD_{L\to H} = 0$)

$Path_{L2\to C1} = T$ $HoldTime_{C2\to C1} = 0$

CLOCKING METHODOLOGY FOR AT-SPEED TESTING OF SCAN CIRCUITS WITH SYNCHRONOUS CLOCKS

CROSS-REFERENCE TO RELATED APPLICATIONS

This application claims the benefit of U.S. Provisional Patent Application Ser. Nos. 60/564,210 and 60/579,649 filed Apr. 22, 2004, and Jun. 16, 2004, respectively, both incorporated herein by reference.

BACKGROUND OF THE INVENTION

1. Field of the Invention

The present invention generally relates to integrated circuits and, more specifically, to at-speed testing of scan circuits having interacting synchronous clock domains.

2. Description of Related Art

Scan circuits consist of logic and memory elements which are configurable in a shift mode and a capture mode. Scannable memory elements are organized into scan chains. Shift mode is used to load test patterns into scan chains in a circuit and unload circuit responses from the circuit. Capture mode is used to capture circuit responses to the test patterns or scan vectors.

Delay tests are performed by launching a signal transition from a source memory element and capturing the effect of the signal transition at a destination memory element. Two methodologies are used to perform delay tests: launch-on-shift, also known as "single capture", and launch-on-capture also known as "double capture". Performing delay tests on Interacting synchronous clock domains present particular problems.

U.S. Pat. No. 5,349,587 issued on Sep. 20, 1994, for "Multiple Clock Rate Test Apparatus for Testing Digital Systems" U.S. Pat. No. 6,145,105 Issued on Nov. 7, 2000 for "Method and Apparatus for Scan Testing Digital Circuits" and U.S. Pat. No. 6,115,827 issued on Sep. 5, 2000 for "Clock Skew Management Method and Apparatus, all incorporated herein by reference, disclose methods of testing circuits having interacting clock domains.

Nadeau-Dostie et al. U.S. Pat. No. 5,349,587 discloses a method for testing paths between memory elements that are clocked by different clocks which are synchronous to each other using the launch-on-shift method. Paths from a lower frequency domain to a higher frequency domain are tested for a propagation time equal to the period of the lower-frequency clock. While this test provides fair coverage of delay defects and simplifies the analysis of the circuit (the circuit to be analyzed is combinational, i.e., sequential depth is 0), it is sometimes desirable to test for a propagation time equal to the period of the higher-frequency clock. The patent does not disclose a method by which this can be achieved. Another limitation of the method is that it does not address the case for which launch-on-capture clocking methodology is used.

Other known methods test for cross-domain path propagation times equal to the period of the highest frequency clock, but the sequential depth of the circuit is such that the coverage of delay defects is relatively low and the circuit analysis time for fault simulation and test generation is prohibitive.

SUMMARY OF THE INVENTION

The present invention seeks to provide a clocking method for at-speed testing of cross-domain paths between synchronous clock domains for a propagation time equal to the period of the higher frequency clock, which minimizes the sequential depth of the circuit to be analyzed and which can be used for both launch-on-shift and launch-on-capture methodologies.

For tests using launch-on-shift methodology, the circuit to be analyzed is combinational and, therefore, has a sequential depth of 0. For circuits using launch-on-capture methodology, the circuit to be analyzed has a sequential depth of 1. The method is particularly useful in a self-test environment because of the predictability of the signal values captured by the scannable memory elements.

The method of the present invention is generally defined as a clocking method for at-speed scan testing for delay defects in cross-domain paths of interacting synchronous clock domains in a scan circuit. Each cross-domain path originates from a source memory element in one of the domains and terminates at a destination memory element in another of the domains and each memory element forms part of a scan chain in the circuit. The method comprises:

selectively aligning either a capture edge or a launch edge of the clock of each domain with a corresponding edge of at least one other domain of the interacting synchronous clock domains to determine the cross-domain paths to be tested between a source domain and a destination domain;

clocking memory elements in each domain at respective domain clock rates to launch signal transitions from source memory elements in source domains;

for each pair of interacting clock domains under test, capturing, in the destination domain, circuit responses to signal transitions launched along paths originating from the source domain and selectively disabling capturing, in the source domain, of circuit responses to signal transitions launched along paths originating from the destination domain; and determining that a delay defect exists on a cross-domain path when a circuit response captured in its associated destination memory element is different from an expected response.

In one embodiment, paths from higher-frequency domains to lower-frequency domains are tested for a propagation time corresponding to the period of the clock which controls source memory elements in higher-frequency domains by aligning the capture edge of the clock of all of the synchronous clock domains, clocking the memory elements at respective domain clock rates to launch signal transitions from the source memory elements and capturing circuit responses in all destination memory elements in lower-frequency domains. Paths from lower-frequency-domains to higher-frequency domains are disabled. Paths from lower-frequency domains to higher-frequency domains are tested for a propagation time corresponding to the period of the clock which controls destination memory elements in higher-frequency domains by aligning the launch edge of the clock of all of the synchronous clock domains, clocking the memory elements at respective domain clock rates to launch signal transitions from the source memory elements and capturing circuit responses in all destination memory elements in higher-frequency domains. Paths from higher-frequency domains to lower-frequency domains are disabled.

According to a first broad aspect of the present disclosure, there is disclosed a clocking method for applying test patterns for detecting delay defects in cross-domain paths between interacting synchronous clock domains in a scan circuit, each said cross-domain path originating from a source memory element in one of said clock domains and terminating at a destination memory element in another of said clock domains and each said memory element forming part of a scan chain in said scan circuit, said scan method comprising the acts of:

selectively aligning, for every test pattern, either a capture edge or a launch edge of each domain clock with a corresponding edge of at least one other domain clock of said interacting synchronous clock domains to determine the cross-domain paths to be tested between a source domain and a destination domain; clocking memory elements in each clock domain at respective domain clock rates to launch signal transitions from source memory elements in source domains; for each pair of interacting clock domains under test, capturing, in the destination domain, circuit responses to signal transitions launched along paths originating from the source domain and selectively disabling capturing, in the source domain, of circuit responses to signal transitions launched along paths originating from the destination domain; and determining that a delay defect exists on a cross-domain path when a circuit response captured in its associated destination memory element is different from an expected response.

According to a second broad aspect of the present disclosure there is disclosed a clocking method for applying test patterns for detecting delay defects in cross-domain paths between interacting synchronous clock domains in a scan circuit, each said cross-domain path originating at a source memory element in one of said clock domains and terminating at a destination memory element in another of said clock domains and each said memory element forming part of a scan chain in said scan circuits, said method comprising, while performing a scan test: testing paths from higher-frequency domains to lower-frequency domains for a propagation time corresponding to the period of the clock which controls source memory elements in said higher-frequency domains by aligning the capture edge of the domain clock of all said synchronous clock domains, clocking said memory elements at respective domain clock rates to launch signal transitions from said source memory elements therein, capturing circuit responses in destination memory elements in interacting lower-frequency domains while selectively disabling capturing, in interacting higher-frequency domains, circuit responses to signal transitions launched from said interacting lower-frequency domains; and testing paths from lower-frequency domains to higher-frequency domains for a propagation time corresponding to the period of the clock which controls destination memory elements in the higher-frequency domains by aligning the launch edge of the clock of all said synchronous clock domains, clocking said memory elements at respective domain clock rates to launch signal transitions from said source memory elements therein; capturing circuit responses in destination memory elements in interacting higher-frequency domains while disabling capturing, in said interacting lower-frequency domains, of circuit responses to signal transitions launched from said interacting higher-frequency domains and determining that a delay defect exists on a cross-domain path when a circuit response captured in its associated destination memory element is different from an expected response.

BRIEF DESCRIPTION OF THE DRAWINGS

These and other features of the invention will become more apparent from the following description in which reference is made to the appended drawings in which:

FIG. 2a illustrates capture edge alignment waveforms of a dual clock alignment for launch-on-shift methodology, according to an embodiment of the present invention, to enable all paths from higher-frequency domains to lower-frequency domains to be tested for a propagation time corresponding to the period of source memory elements, the period of the higher frequency clock;

FIG. 2b illustrates launch clock alignment waveforms of a dual clock alignment for launch-on-shift methodology, according to an embodiment of the present invention, to enable all paths from lower-frequency domains to higher-frequency domains to be tested for a propagation time corresponding to the period of destination memory elements, the period of the higher frequency clock, according to an embodiment of the present invention;

DETAILED DESCRIPTION OF EMBODIMENTS OF THE INVENTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

The present invention uses a dual clock alignment to detect delay defects on cross-domain paths that originate at a source memory element in one domain and terminate at a destination memory element in another domain. The dual clock alignments are alignment of capture edges and alignment of launch edges. The first clock alignment aligns the capture edge of all interacting synchronous clock domains under test to enable all paths from higher-frequency domains to lower-frequency domains to be tested for a propagation time corresponding to the period of source memory elements—the period of the higher frequency clock. The second clock alignment aligns the launch edge of all clock domains under test to enable all paths from lower-frequency domains to higher-frequency domains to be tested for a propagation time corresponding to the period of destination memory elements—the period of the higher frequency clock.

In the launch-aligned embodiment, the capture operation of destination memory elements which could cause an increase of the sequential depth of the circuit is suppressed. These are paths from higher-frequency domains to lower-frequency domains. In the capture-aligned embodiment, paths from lower-frequency domains to higher-frequency domains would cause an increase of the sequential depth. In launch-on-capture methodology, circuitry is provided to disable such paths, whereas in launch-on-shift methodology, such circuitry is not necessary. Capture suppression can be performed by configuring the memory element in a non-capture mode, such as shift mode or hold mode. The hold mode can be implemented by adding a holding multiplexer to a scannable memory element or by gating the clock of the memory element. The hold time between two clock domains is verified concurrently with verification of the propagation time between two domains.

Figure 1:
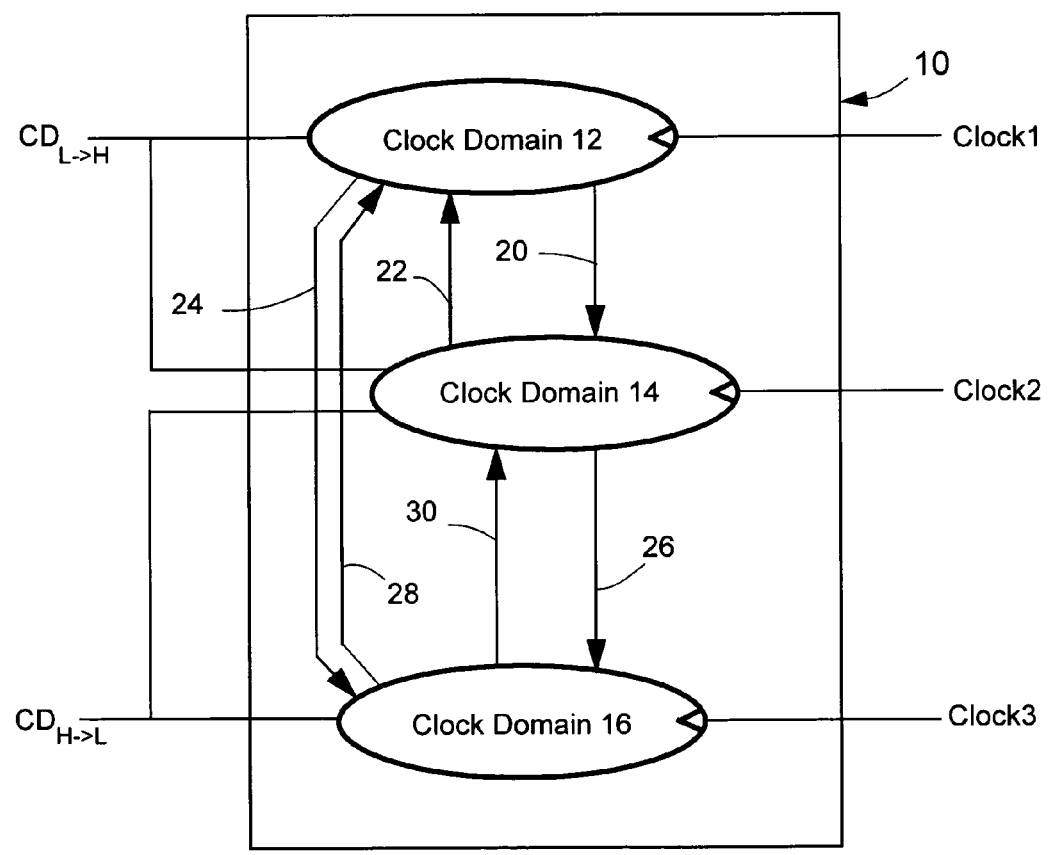
FIG. 1 diagrammatically illustrates a simple circuit having three interacting synchronous clock domains.

FIG. 1 diagrammatically illustrates a simple circuit 10 having three interacting synchronous clock domains 12, 14 and 16 with respective clocks Clock1, Clock2 and Clock3 and cross-domain paths. The frequencies of these clocks are multiples of each other. For example, Clock1 might have a frequency F with an associated period T=1/F, Clock2 has frequency F/2 with associated period 2T, Clock3 has frequency F/4 with period 4T Each domain includes one or more scan chains (not shown) having memory elements (not shown) which are configurable in shift mode, used for loading test patterns and unloading circuit responses to the test patterns, and in capture mode, used for capturing circuit responses, as is well known in the art. The cross-domain paths originate at the output of a source memory element in one of the domains and terminate at the input of a destination memory element in another of the domains. Destination memory elements in each domain also receive a capture disable signal, CD, used for selectively disabling the capture operation of a destination memory element, as described below. For simplicity, the following description describes only the interaction between domains 12 and 14.

Launch-On-Shift Methodology

FIGS. 2a and 2b show dual clock alignment waveforms for launch-on-shift methodology. FIG. 2a shows four signals. Shift1 is a shift enable signal used to configure memory elements controlled by Clock1 in shift mode. Shift2 serves the same purpose for memory elements controlled by Clock2. Clock1 and Clock2 are synchronous and their respective clock periods are T and 2T In the example, Shift1 and Shift2 are active high.

Signal transitions launched from a Clock1 edge are labeled L1 and transitions launched from a Clock2 edge are labeled L2. In accordance with launch-on-shift methodology, these transitions are launched from memory elements that are configured in shift mode. After the launch occurs, the memory elements are configured in capture mode (inactive value of Shift1 and Shift2) and a capture operation occurs on the Clock1 edge labeled C1 and on the Clock2 edge labeled C2.

In accordance with one step of the method of the present invention, capture edges C1 and C2 are aligned during the capture operation. With this alignment, all cross-domain paths are observable. Paths 20 originating from source memory elements controlled by the higher-frequency clock (Clock1) and terminating at destination memory elements controlled by the lower-frequency clock (Clock2) are tested for a propagation time of T—the period of the higher frequency clock. Paths 22 originating from source memory elements controlled by the lower-frequency clock (Clock2) and terminating at destination memory elements controlled by the higher-frequency clock (Clock1) are tested for a propagation time of 2T—the period of the lower frequency clock. The hold time relationship between Clock1 and Clock2 is also tested in both directions. These tests are performed by comparing a captured circuit response against a predetermined circuit response. For example, if a defect causes C2 to be late to the point where the signal value captured at C2 depends on the signal value captured at C1, instead of the signal values launched on L1 and L2 exclusively, this defect will be detected by an incorrect value in the captured circuit response.

In accordance with another step of the present invention, launch edges L1 and L2 are aligned prior to a capture operation. This alignment is used to test paths from lower-frequency domains to higher-frequency domains. In FIG. 2b, these are paths L2→C1. Paths originating from source memory elements controlled by the higher-frequency clock (Clock1) and terminating at destination memory elements controlled by the lower-frequency clock (Clock2) (paths L1→C2) are blocked by suppressing or disabling the capture operation of the destination memory elements. This is achieved by applying a Capture Disable signal, $CD_{H-L}$, to the appropriate destination memory elements. This minimizes the sequential depth of the circuit. If the capture operation is not suppressed, the signal value captured at C2 will depend on the signal value captured at C1, instead of the signal values launched from L1 and L2 exclusively. In the waveforms shown, the circuit remains combinational which simplifies analysis significantly, both fault simulation and test pattern generation.

A control signal determines the edge alignment to be used and the suppression of the capture operation of destination memory elements which would cause an increase of circuit sequential depth for a given clock alignment. The control signal can be generated by an embedded test controller or an external tester as is the case for signal ClkAlignment in Applicant's co-pending Application No. 60/564,210, supra, which also describes a method by which the edges can be aligned. The value of the edge alignment signal can be selected randomly for each test pattern or kept constant for a group of test patterns.

In general, for circuits having more than two frequencies, the capture edge of all clock domains under test may be aligned first. This alignment will enable all paths from higher-frequency domains to lower-frequency domains to be tested for a propagation time corresponding to the period of the clock of source memory elements—the period of the higher-frequency clock. The hold time between all clock domains is also verified.

The following description describes the interaction between domains 12, 14 and 16. Clock domain 16 is clocked by a Clock3 (not shown) which has a period 4T and which is synchronous with respect to Clock1 and Clock2. The launch edge L3 and capture edge C3 of clock domain 16 are not shown. In accordance with an embodiment of the present invention, capture edges C1, C2 and C3 are aligned first. Paths 20 from clock domain 12 to clock domain 14 (paths L1→C2) and paths 24 from clock domain 12 to clock domain 16 (paths L1→C3) are all tested for a propagation time of T Paths 26 from clock domain 14 to clock domain 16 (paths L2→C3) are tested for a propagation time of 2T—the period of the higher-frequency clock.

The second clock alignment aligns the launch edge of the clock of all clock domains. This alignment tests all paths from lower-frequency to higher-frequency domains for a propagation time corresponding to the period of the destination memory element—the period of the higher frequency clock. Therefore, paths 22 from clock domain 14 to clock domain 12 (paths L2→C1) and paths 28 from clock domain 16 to clock domain 12 (paths L3→C1) are tested for a propagation time of T and paths 30 from clock domain 16 to clock domain 14 (paths L3→C2) are tested for a propagation time of 2T.

Paths from higher-frequency domains to lower-frequency domains, i.e., paths L1→C2, paths L1→C3 and paths L2→C3 (paths 20, 24, and 26 in FIG. 1), are blocked to limit the sequential depth of the circuit. In fact, the offending paths are better described by L1→C1→C2; L1→C1→C3; L2→C2→C3.

Destination memory elements can receive signal transitions from several clock domains, including its own. Thus, some useful paths are blocked when such a destination memory element receives signal transitions from domains having frequencies that are both higher and lower than its own. While this situation should be relatively rare and the test will still cover most delay defects, if it is desired to improve the test, a third clock alignment, in which some launch edges are aligned and some capture edges are aligned, can be used to test paths which were previously blocked.

In the foregoing example, paths from clock domain 16 to clock domain 14 that end at a destination memory element that also receives signals from clock domain 12 cannot be tested for a propagation time of 2T The paths are tested for a propagation time of 4T instead. However, a third clock alignment which aligns launch edges L2 and L3 and capture edges C1 and C2 will allow testing of paths from clock domain 16 to clock domain 14 (paths L3→C2) correctly. For this clock alignment, the paths L1→C2 need not be blocked, thus allowing for testing for a propagation time of 2T on paths L3→C2, if desired.

In the examples above, it is possible that some paths will be longer than the period of the source or the destination memory element. There are at least two solutions to this problem. The first is to use the solution described and claimed in Applicants' U.S. Pat. No. 6,145,105 that will cause the launch edge of the source memory element to occur earlier than that used by other memory elements of the same clock domain. The other is to use the clock alignment control signal to suppress the capture of destination memory elements.

Launch-On-Capture Methodology

Figure 3A:
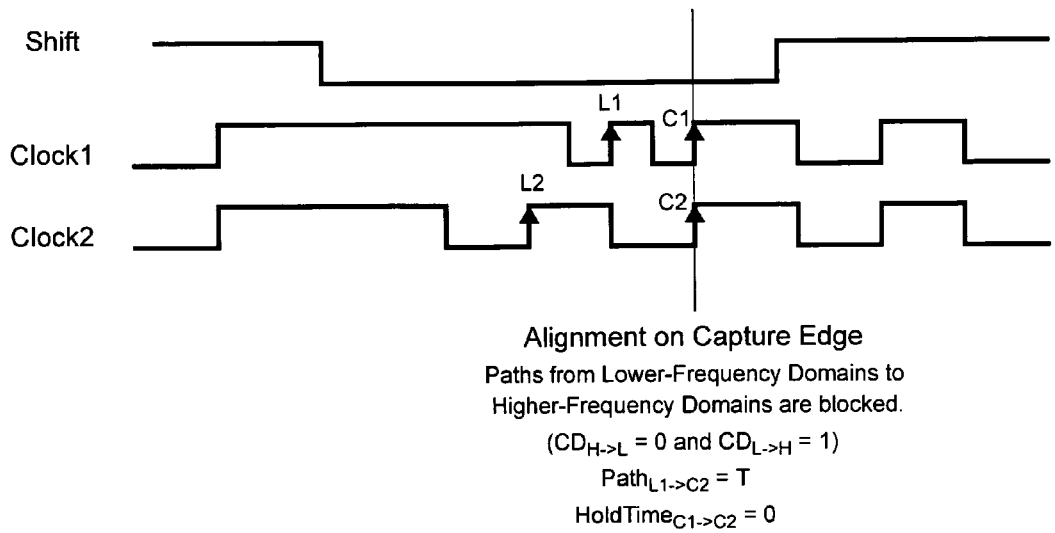
FIG. 3a illustrates capture edge alignment waveforms of a dual clock alignment for launch-on-capture methodology, according to an embodiment of the present invention, to enable all paths from higher-frequency domains to lower-frequency domains to be tested for a propagation time corresponding to the period of source memory elements.
Figure 3B:
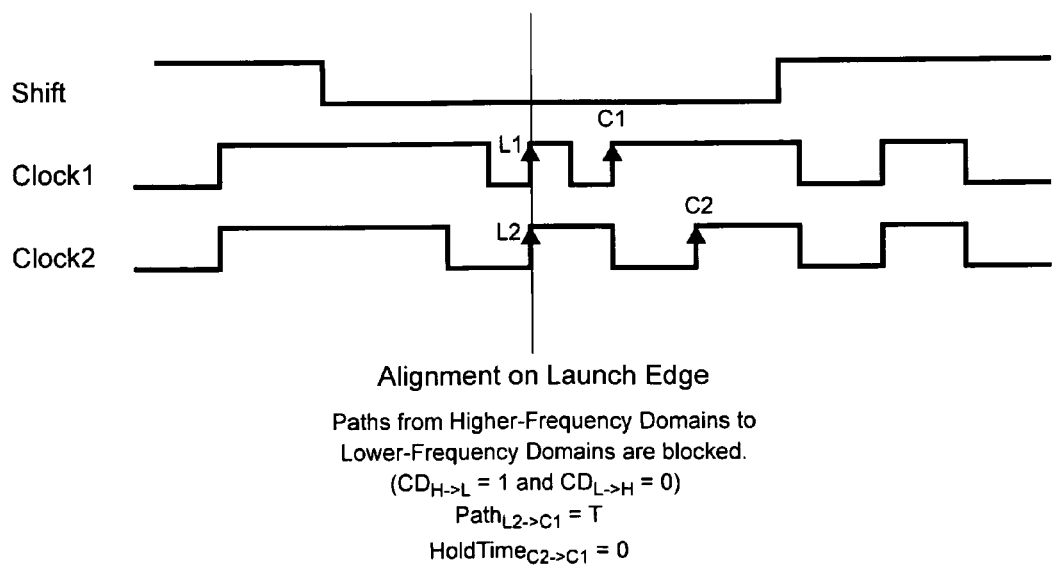
FIG. 3b illustrates launch edge alignment waveforms of a dual clock alignment for launch-on-capture methodology, according to an embodiment of the present invention, to enable all paths from lower-frequency domains to higher-frequency domains to be tested for a propagation time corresponding to the period of destination memory elements.

FIGS. 3*a* and 3*b* show waveforms for dual clock alignment for launch-on-capture methodology. Three signals are shown. Shift is a shift enable signal used to configure all memory elements in shift mode. Clock1 and Clock2 are synchronous and their respective clock period is T and 2T Signal transitions are launched from the Clock1 edge labeled L1 and from the Clock2 edge labeled L2. It will be noted that these transitions are launched from memory elements that are configured in capture mode (Shift is active high).

In accordance with the present invention, capture edges C1 and C2 are aligned to test paths from source memory elements controlled by higher-frequency clock, Clock1, to destination memory elements controlled by lower-frequency Clock2 for a propagation time of T—the period of the higher frequency clock. The hold time relationship from Clock1 to Clock2 is also tested (HoldTime$_{c1 \to c2}$=0). Paths from lower-frequency clock domain 14 to higher-frequency clock domain 12 are suppressed to minimize the sequential depth of the circuit.

Launch edges L1 and L2 are aligned to test paths from lower-frequency clock domain 14 to higher-frequency clock domain 12 for a propagation time of T while paths from higher-frequency clock domain 12 to lower-frequency clock domain 14 are blocked. Hold time from Clock2 to Clock1 is also tested.

The control signal to select the clock alignment is generated in the manner explained for the launch-on-shift methodology, except that both the control signal and its inverted value are used to generate Capture Disable control signals labeled CD$_{H-L}$ and CD$_{L-H}$ in FIG. 3. CD$_{L-H}$ suppresses paths from lower-frequency clock domain 14 to higher-frequency clock domain 12. CD$_{H-L}$ suppresses paths from higher-frequency clock domain 12 to lower frequency clock domain 14.

Again, for circuits with more than two frequencies, a first clock alignment aligns the capture edge of all clocks. This will enable all paths from higher-frequency domains to lower-frequency domains to be tested for a propagation time corresponding to the period of the source memory element—the higher-frequency clock. Paths from lower-frequency domains to higher-frequency domains are blocked. The hold times from higher-frequency domains to lower-frequency domains are also tested.

As in the launch-on-shift methodology, some useful paths are blocked when a memory element receives signal transitions from domains having clock frequencies that are both higher and lower than its own. The clock alignment solution presented above can be used to test all useful paths. A partial solution using the method proposed in U.S. Pat. No. 6,115,827 can be used instead of using a third clock alignment in order to reduce complexity. For example, a destination memory element of clock domain 14 receiving signals from source memory elements of clock domain 16 and clock domain 12 would have its capture suppressed whenever the launch edges are aligned or the source memory element of clock domain 16 is allowed to capture. It is otherwise allowed to capture on capture edge C2 as long as the source memory element in clock domain 16 is configured in hold mode on its launch edge L3.

Again, In the examples above, it is possible that some paths are longer than the period of the source or the destination memory element. There are at least two solutions to this problem and they are similar to the ones used for the launch-on-shift case. The first is to use the solution of U.S. application Ser. No. 09/773,541 filed Feb. 2, 2001 for "Method for Scan Testing of Digital Circuits, Integrated Circuit for Use Therewith and Program Product for Incorporating Test Method into Circuit" that will cause the launch edge of the source memory element to occur earlier than that used by other memory elements in the same clock domain. The other solution is to use the control signal to suppress the capture of destination memory elements.

In summary, it will be seen that the present invention provides a clocking methodology for at-speed testing of cross-domain paths between synchronous clock domains for a propagation time equal to the period of the higher frequency clock as well as testing for hold time violations. The method minimizes the sequential depth of the circuit and that the method can be used for both launch-on-shift and launch-on-capture methodologies.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

What is claimed is:

1. A clocking method for applying test patterns for detecting delay defects in cross-domain paths between interacting synchronous clock domains in a scan circuit, each said cross-domain path originating from a source memory element in one of said clock domains and terminating at a destination memory element in another of said clock domains and each said memory element forming part of a scan chain in said scan circuit, said scan method comprising the acts of:

selectively aligning, for every test pattern either a capture edge or a launch edge of each domain clock with a corresponding edge of at least one other domain clock of said interacting synchronous clock domains to determine the cross-domain paths to be tested between a source domain and a destination domain;

clocking memory elements in each clock domain at respective domain clock rates to launch signal transitions from source memory elements in source domains;

for each pair of interacting clock domains under test, capturing, in the destination domain, circuit responses to signal transitions launched along paths originating from the source domain and selectively disabling capturing, in the source domain, of circuit responses to signal transitions launched along paths originating from the destination domain; and determining that a delay defect exists on a cross-domain path when a circuit response captured in its associated destination memory element is different from an expected response.

2. The method as defined in claim 1, further including the act of repeating a test with the other of said capture edge and launch edge selected.

3. The method as defined in claim 1, wherein, in the act of selectively aligning, the edge to be aligned for each test pattern applied to said scan circuit is the same.

4. The method as defined in claim 1, wherein, in the act of selectively aligning, the edge to be aligned for each vector of a group of test patterns applied to said scan circuit is the same.

5. The method as defined in claim 1, wherein, in the act of selectively aligning, the edge to be aligned for each test pattern applied to said scan circuit is randomly selected.

6. The method as defined in claim 1, wherein said selectively disabling capturing includes suppressing a capture operation of destination memory elements which could cause an increase of the sequential depth of the circuit.

7. The method as defined in claim 1, wherein the acts of selectively disabling capturing are performed under control of a clock edge alignment signal.

8. The method as defined in claim 1, further including, for circuits employing launch-on-shift methodology, suppressing paths from a higher-frequency domain to a lower-frequency domain when said launch edge is selected.

9. The method as defined in claim 1, wherein said act of selectively disabling capturing comprises configuring destination memory elements in said paths in a non-capture mode.

10. The method as defined in claim 9, wherein said non-capture mode is either a shift mode or a hold mode.

11. The method as defined in claim 1, further including, for circuits employing launch-on-capture methodology, suppressing paths from a lower-frequency domain to a higher-frequency domain when the selectively aligned edge is the capture edge and suppressing paths from a higher-frequency domain to a lower-frequency domain when the selectively aligned edge is the launch edge.

12. The method as defined in claim 1, wherein the act of selectively aligning includes generating an edge alignment signal for selecting between a capture edge alignment and a launch edge alignment; and the act of selectively disabling capturing includes applying a control signal to destination memory elements in destination domains to enable or disable capturing the circuit response therein.

13. The method as defined in claim 1, further including, where said scan circuit has more than two synchronous clock domains, aligning the capture edge of the domain clock of all said more than two clock domains to enable all paths from a higher-frequency domain to a lower-frequency domain to be tested for a propagation time corresponding to the period of higher frequency clocks and to verify the hold time between all clock domains.

14. The method as defined in claim 13, further including, aligning the launch edges with the domain clock of all said more than two synchronous clock domains to enable all paths from lower-frequency to higher-frequency domains to be tested for a propagation time corresponding to the period of the destination memory element while blocking paths from higher-frequency domains to lower-frequency domains.

15. The method as defined in claim 14, further including, aligning the launch edges of some of said more than two synchronous clock domains and aligning capture edges of the remaining synchronous clock domains.

16. The method as defined in claim 1, further including, for a circuit having at least two synchronous clock domains, aligning the capture edge with the domain clock of all said at least two synchronous clock domains to enable all paths from a higher-frequency domain to a lower-frequency domain and blocking paths from a lower-frequency domain to a higher-frequency domain to test for a propagation time corresponding to the period of higher frequency clocks and verifying the hold time between all clock domains.

17. The method as defined in claim 16, further including, aligning the launch edge with the domain clock of all of said at least two clock domains and blocking paths from a higher-frequency domain to a lower-frequency domain to enable all paths from a lower-frequency domain to a higher-frequency domain to be tested for a propagation time corresponding to the period of the destination memory element.

18. The method as defined in claim 17, further including, aligning launch edges of some of said at least two clock domains and aligning capture edges of said remaining clock domains.

19. A clocking method for applying test patterns for detecting delay defects in cross-domain paths between interacting synchronous clock domains in a scan circuit, each said cross-domain path originating at a source memory element in one of said clock domains and terminating at a destination memory element in another of said clock domains and each said memory element forming part of a scan chain in said scan circuit, said method comprising, while performing a scan test, the acts of:

testing paths from higher-frequency domain to a lower-frequency domains for a propagation time corresponding to the period of the clock which controls source memory elements in said higher-frequency domains by aligning the capture edge of the domain clock of all said synchronous clock domains, clocking said memory elements at respective domain clock rates to launch signal transitions from said source memory elements therein, capturing circuit responses in destination memory elements in interacting lower-frequency domains while selectively disabling capturing, in interacting higher-frequency domains, circuit responses to signal transitions launched from said interacting lower-frequency domains; and testing paths from lower-frequency domain to higher-frequency domains for a propagation time corresponding to the period of the clock which controls destination memory elements in the higher-frequency domain by aligning the launch edge of the domain clock of all said synchronous clock domains, clocking said memory elements at respective domain clock rates to launch signal transitions from said source memory elements therein; capturing circuit responses in destination memory elements in interacting higher-frequency domains while disabling capturing, in said interacting lower-frequency domain, of circuit responses to signal transitions launched from said interacting higher-frequency domain and determining that a delay defect exists on a cross-domain path when a circuit response captured in its associated destination memory element is different from an expected response.

20. The method as defined in claim 19, said selectively disabling capturing including suppressing the capture operation of any destination memory elements which could cause an increase of the sequential depth of the circuit.

21. The method as defined in claim 19, further including, testing paths in which destination memory elements that were not selected to capture a circuit response by aligning launch edges with the domain clock of some of said clock domains and aligning capture edges of the domain clock of remaining clock domains prior to launching a signal transition from the source memory elements and capturing circuit responses in said destination memory elements.

* * * * *